(12) United States Patent
Tedrow

(10) Patent No.: US 8,804,411 B1
(45) Date of Patent: Aug. 12, 2014

(54) DUAL MODE CLOCK AND DATA SCHEME FOR MEMORY PROGRAMMING

(75) Inventor: Kerry Dean Tedrow, Folsom, CA (US)

(73) Assignee: Micron Technology, Inc, Boise, ID (US)

( * ) Notice: Subject to any disclaimer, the term of this patent is extended or adjusted under 35 U.S.C. 154(b) by 602 days.

(21) Appl. No.: 12/557,723

(22) Filed: Sep. 11, 2009

(51) Int. Cl.
*G11C 11/00* (2006.01)

(52) U.S. Cl.
USPC . 365/163; 365/189.05; 365/194; 365/233.01; 365/233.1; 365/233.5

(58) Field of Classification Search
USPC ............... 365/148, 163, 189.05, 194, 233.5, 365/233.01, 233.1
See application file for complete search history.

(56) References Cited

U.S. PATENT DOCUMENTS

| 2007/0255891 A1* | 11/2007 | Chow et al. | 711/103 |
| 2008/0137402 A1* | 6/2008 | Cho et al. | 365/163 |
| 2009/0122602 A1* | 5/2009 | Takemura et al. | 365/163 |
| 2011/0235459 A1* | 9/2011 | Ware et al. | 365/233.11 |

* cited by examiner

*Primary Examiner* — Tha-O H Bui
(74) *Attorney, Agent, or Firm* — Schwegman, Lundberg & Woessner, P.A.

(57) ABSTRACT

A Phase-Change Memory (PCM) includes a factory programming interface to receive data changing on both a positive transition and a negative transition of a dual edge clock. A transition detector generated internal clock provides a delayed edge to latch the program data. This dual-edge clock scheme provides a doubling in the data transfer rate.

16 Claims, 3 Drawing Sheets

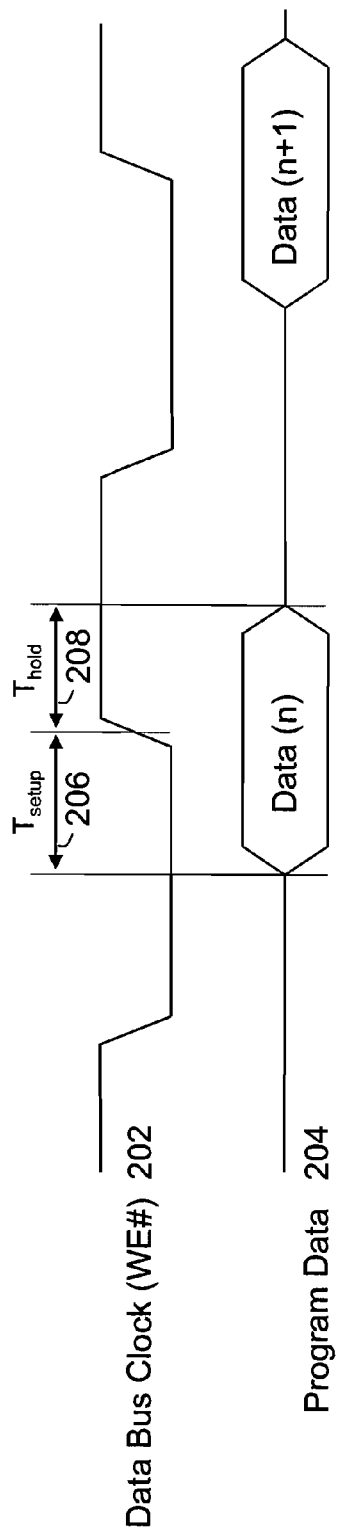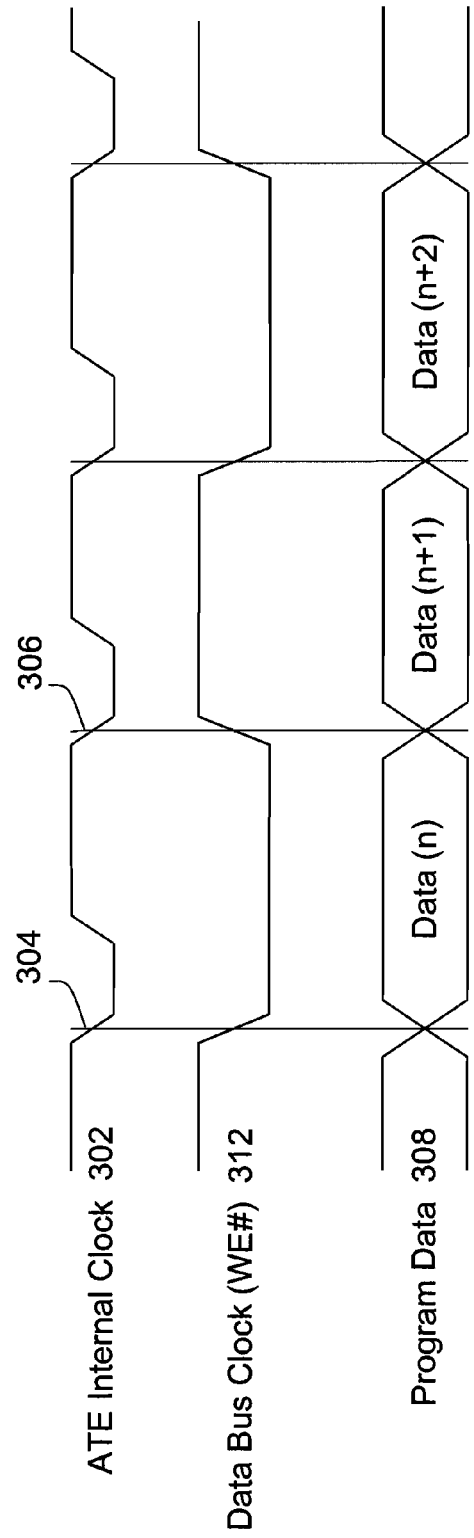

DUAL MODE CLOCK AND DATA SCHEME FOR MEMORY PROGRAMMING

BACKGROUND OF THE INVENTION

The Phase-Change Memory (PCM) technology is a promising alternative to the nonvolatile memory mainstream constituted by the Flash technology. However, high-temperature soldering will cause previously programmed PCM cell(s) to change states. Therefore an improved method of inputting new data to program the PCM memory device in the factory after soldering is needed.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 2 illustrates the system memory interface receiving data synchronized by a clock signal (WE #) that is generated by the CPU;

FIG. 3 shows internal bus cycles of the Automated Test Equipment (ATE) using a dual-edge clock scheme used to transfer data to system memory interface;

Figure 1:
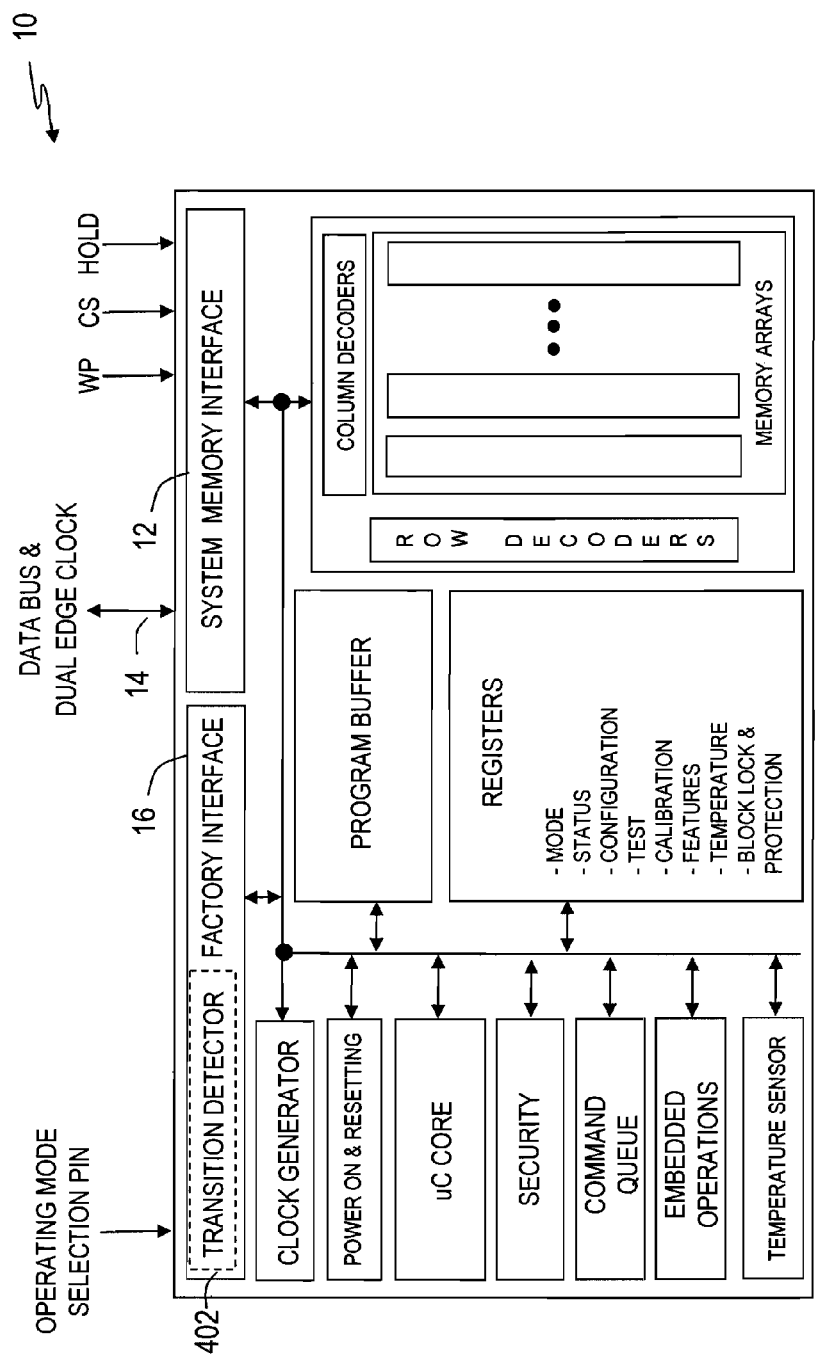
FIG. 1 illustrates a Phase-Change Memory (PCM) device having a system mode for executing system applications and a factory programming mode in accordance with the present invention.

It will be appreciated that for simplicity and clarity of illustration, elements illustrated in the figures have not necessarily been drawn to scale. For example, the dimensions of some of the elements may be exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Use of the terms "coupled" and "connected", along with their derivatives, may be used. It should be understood that these terms are not intended as synonyms for each other. Rather, in particular embodiments, "connected" may be used to indicate that two or more elements are in direct physical or electrical contact with each other. "Coupled" may be used to indicated that two or more elements are in either direct or indirect (with other intervening elements between them) physical or electrical contact with each other, and/or that the two or more elements co-operate or interact with each other (e.g. as in a cause and effect relationship).

A Phase-Change Memory (PCM) uses chalcogenide chemistry where the application of heat melts the material for the two energy states for any particular bit. However, subjecting the PCM to external heat may bring about instability in the retention of data. The high resistance amorphous state, for example, may have sufficient activation energy as to be susceptible to relaxation into the low-resistance crystalline state with the application of this external heat, resulting in a loss of data. This loss of stored data is problematic for the PCM device.

The boot code that operates the uC core that resides in the PCM may not be reliable after the memory device is subjected to high-temperatures. This code should not be made available and options for obtaining a new boot code should be initiated. These options include uploading a new code to the system through an interface in accordance with embodiments of the present invention, where after installation the in-factory programming data may also be transferred to the PCM.

FIG. 1 illustrates a PCM memory device 10 having a system mode for executing system applications and a factory programming mode to overcome heat related characteristics associated with PCM devices. On initial power up PCM memory device 10 defaults to the system mode. Then, a special command may be received through data bus 14 that instructs PCM memory device 10 to switch to the factory programming mode, e.g. a factory-optimized mode. After completion of the factory programming another special command may be received on data bus 14 that instructs PCM memory device 10 to revert back to the system mode. Alternatively, a special input pin may be used to select the operating mode as either the system mode or the factory programming mode rather than commands received via the data bus.

With PCM memory device 10 selected for operation in the system mode, data and commands may be transferred from a host CPU through data bus 14 and received by an enabled system memory interface 12. Memory interface 12 operates as a fast I/O interface that significantly improves overall system performance and avoids PCM memory device 10 being the performance bottleneck. When enabled, system memory interface 12 responds to various selected signaling options.

To accomplish data transfers, system memory interface 12 may provide a serial data input, or alternatively, provide a higher bandwidth through a synchronous interface that waits for a clock signal before responding to control inputs. System memory interface 12 may provide Synchronous Dynamic Random Access Memory (SDRAM) or other alternatives for data transfers such as a Double-Data-Rate (DDR) SDRAM that achieves nearly twice the bandwidth by transferring data on the rising and falling edges of the clock signal without increasing the clock frequency, or DDR2 or DDR3 that enable even higher bus rates and higher peak rates than earlier memory technologies.

Automated Test Equipment (ATE) may provide communication with memory device 100 via the data bus and a dual edge clock 14. The external ATE with an In Circuit Tester (ICT), for example, drives data bus 14 to provide programming data in a factory environment. The internal clock speeds of the ATE along with cabling signal integrity limit the programming clock rate and may significantly impact factory programming.

FIG. 2 illustrates one embodiment of system memory interface 12 receiving data synchronized by a clock signal (WE #) 202 that is generated by the CPU. Typically, the frequency of the clock is selected to ensure that the data transfer rate on data bus 14 is higher than the memory's internal programming speed so as not to hinder system performance. In this embodiment the program data 204 on data bus 14 is transferred in each clock period and may be latched in system memory interface 12 on either the rising edge or the falling edge of the clock. In the illustrated example the rising edge of the clock signal is chosen to latch program data 204. Note that the data on data bus 14 is held steady during the rising edge of the clock transition to ensure that the proper data is latched, a condition ensured by specifying and satisfying a setup (Tsetup) timing requirement 206 and a hold (Thold) timing requirement 208.

FIG. 3 illustrates an embodiment showing internal bus cycles of the ATE used to transfer factory data also using the data bus and dual edge clock 14. After switching from the system mode to the factory programming mode, programming data again transfers into memory device 100 via data bus 14, with the function of the input pins dependant upon the operating mode. The dual-edge clock scheme captures data on the data bus on both a positive transition and a negative transition of a Data Bus Clock 312. The ATE in normal operation acts as a simple pattern generator to provide program data having signal transitions aligned with the ATE's internal clock 302. In accordance with features of the present invention the ATE changes program data 308 on successive negative transitions 304, 306 of the ATE's internal clock 302. The ATE delivers one piece of program data for each internal bus cycle of the ATE. This dual-edge clock scheme shows a 2× (doubling) speed-up in the data transfer rate compared to the embodiment shown in FIG. 2.

Figure 4:
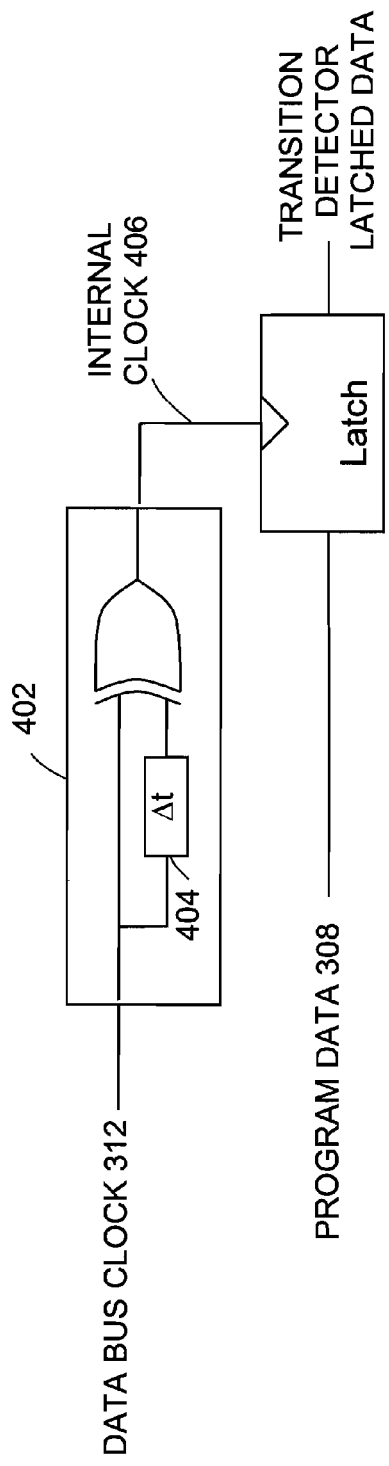
FIG. 4 shows a transition detector circuit embedded within the factory programming interface that converts the received dual-edge data bus clock into a single-edged clock.

FIG. 4 shows a circuit diagram for one embodiment of a transition detector circuit 402 embedded within factory programming interface 16 that converts the received dual-edge data bus clock 312 into a single-edged clock 406. Briefly referring to FIG. 3, notice that program data 308 transitions occur simultaneously with data bus clock 312 transitions and this condition violates setup and hold timing requirements. To rectify this timing violation, transition detector circuit 402 includes a time delay element 404 that shifts the generated internal clock 406 output relative to program data 308, and thereby, allows the setup and the hold timing to be satisfied. Time delay element 404 may include a series of devices to provide a desired number of gate delays.

The embodiment of transition detector 402 shows an EXCLUSIVE-OR gate receiving the data bus clock 312 signal and a delayed version of that signal. Transition detector circuit 402 detects a transition on data bus clock 312 and outputs a pulsed internal clock 406 having a duration Dt that latches program data 308. It should be understood that different embodiments of transition detector circuit 402 may include either a non-inverting or an inverting time delay element 404 and either an EXCLUSIVE-NOR gate or an EXCLUSIVE-OR gate in generating a positive transition or negative transition in the desired time delayed pulse used to latch program data 308.

Figure 5:
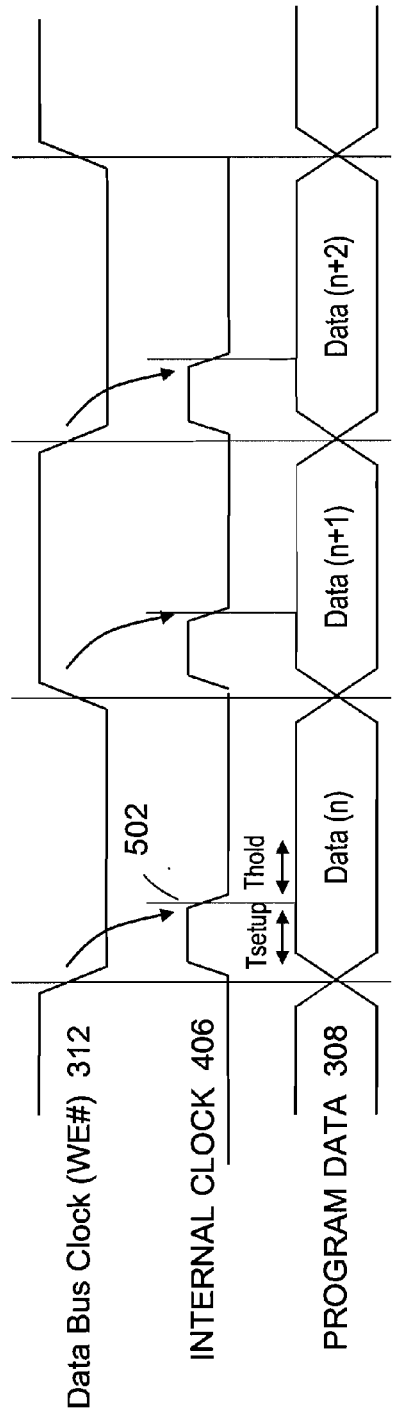
FIG. 5 is a timing diagram showing the ATE dual-edge clock scheme where the delayed edge of the transition detector latches the program data to satisfy the setup (Tsetup) timing requirement and the hold (Thold) timing requirement.

FIG. 5 is a timing diagram showing the ATE dual-edge clock scheme with program data 308 switching with transitions of the data bus clock 312. Also shown is the transition detector generated internal clock 406 that provides a delayed edge 502 used to latch program data 308. The figure shows that by using delayed edge 502 the setup (Tsetup) timing requirement and the hold (Thold) timing requirement are satisfied and the proper data is latched.

Additionally, during factory programming it may be possible to increase the width of the data bus by redefining selected control pins as data-pins. This has a significant impact on bandwidth for serial memories where the data bus is normally only one bit wide. Redefining one control pin as a data pin provides a doubling of the data rate. By way of example, serial flash memory devices have three pins whose functions may be redefined as data input pins for factory optimized mode. Namely, pins CS, Write Protect #, and Hold # may be redefined in a factory programming mode as data bus pins to increase the data bus width from one pin to four pins, giving a 4× increase in data transfer rate.

By now it should be apparent that embodiments of the present invention provide a dual mode clock and data scheme for memory programming. The In-Circuit-Tester (ICT) is designed to find opens and shorts (analog measurements) and is not optimized for high-speed digital testing. Typically, the ICT internal clock frequency may only be 5 Mhz compared to a frequency of 100 Mhz for the system clock. By using the factory programming interface to receive data transferred from an ATE using the dual-edge clock scheme, data may change on both a positive transition and a negative transition of the data bus clock. A transition detector generated internal clock provides a delayed edge to latch the program data. This dual-edge clock scheme provides a doubling in the data transfer rate.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. A Phase-Change Memory (PCM) device comprising a factory interface to receive factory program data on a data bus switching with a dual edge clock, the factory interface including transition detector circuit to generate a transition detector generated internal clock to provide a delayed edge to latch the factory program data for storage in the PCM device, wherein the factory interface is located in the PCM device.

2. The PCM device of claim 1, wherein the transition detector circuit includes a two-input semiconductor device to receive the dual edge clock and a delayed version of the dual edge clock to generate a pulsed signal.

3. The PCM device of claim 2, wherein the transition detector circuit detects a transition on the dual edge clock and generates the pulsed signal to latch the program data.

4. The PCM device of claim 1, further including a program buffer coupled to the factory interface to receive latched program data to prepare for storage in PCM arrays.

5. A Phase-Change Memory (PCM) device, comprising:
 a system memory interface to operate in a system mode selected as a default operating mode to receive data and commands from a data bus; and
 a factory programming interface to operate in a factory programming mode to receive factory program data on the data bus and a dual edge clock that is used to generate an internal clock to provide a delayed edge to latch the factory program data, the factory programming interface including a circuit, wherein the factory programming interface is located in the PCM device.

6. The PCM device of claim 5, wherein the factory program data received from an external source switches with transitions of the dual edge clock.

7. The PCM device of claim 5, wherein a command received through the data bus instructs the PCM device to switch to the factory programming mode.

8. The PCM device of claim 5, wherein another command received on the data bus instructs the PCM device to revert back to the system mode.

9. The PCM device of claim 5, wherein an input pin directs the PCM device to operate in the system mode or the factory programming mode.

10. A Phase-Change Memory (PCM), comprising:

a PCM array;

a system memory interface operating in a system mode for executing system applications; and a factory programming interface operating in a factory programming mode to receive program data on a data bus to overcome heat related storage failures associated with the PCM device, the factory programming interface including a circuit, wherein the factory programming interface is located in the PCM, wherein the factory programming interface receives factory program data switching with transitions of a dual edge clock, and wherein the circuit of the factory programming interface includes a transition detector circuit to generate an internal clock to provide a delayed edge to latch the factory program data for storage in the PCM.

11. The PCM of claim 10, wherein the PCM redefines one or more control pins as data pins in a factory programming mode to increase a width of the data bus and increase a programming data rate.

12. The PCM of claim 10, wherein the factory programming interface uses a dual-edge clock scheme to provide a doubling in the data transfer rate.

13. A Phase-Change Memory (PCM), comprising:

a PCM array;

a system memory interface operating in a system mode for executing system applications; and a factory programming interface operating in a factory programming mode to receive program data on a data bus to overcome heat related storage failures associated with the PCM device, the factor programming interface including a circuit, wherein the factor programming interface is located in the PCM, wherein the circuit of the factory programming interface includes a transition detector circuit to receive the dual edge clock and a delayed version of the dual edge clock to generate a pulsed signal, and wherein the transition detector circuit detects a transition on the dual edge clock to generate the pulsed signal to latch the program data.

14. A nonvolatile memory device, comprising:

a system memory interface; and a factory programming interface to receive factory program data and a dual edge clock, wherein the factory interface includes a transition detector circuit to receive the dual edge clock and generate a delayed version of the dual edge clock to provide a delayed edge to latch the factory program data for storage in the nonvolatile memory device, wherein the factory programming interface is located in the nonvolatile memory device.

15. The nonvolatile memory device of claim 14, wherein the transition detector circuit includes an EXCLUSIVE-OR device to receive the dual edge clock and the delayed version of the dual edge clock to generate a pulsed signal to latch the factory program data.

16. The nonvolatile memory device of claim 14, wherein the factory program data is stored in a Phase-Change Memory (PCM) device.

* * * * *

UNITED STATES PATENT AND TRADEMARK OFFICE
CERTIFICATE OF CORRECTION

PATENT NO.         : 8,804,411 B1  
APPLICATION NO.    : 12/557723  
DATED              : August 12, 2014  
INVENTOR(S)        : Kerry Dean Tedrow Page 1 of 1

It is certified that error appears in the above-identified patent and that said Letters Patent is hereby corrected as shown below:

In the Claims

Column 6, line 2, In Claim 13, delete "factor" and insert -- factory --, therefor.

Column 6, line 3, In Claim 13, delete "factor" and insert -- factory --, therefor.

Signed and Sealed this  
Fourth Day of November, 2014

Michelle K. Lee  
*Deputy Director of the United States Patent and Trademark Office*